US010089429B2

(12) United States Patent
Hirschman et al.

(10) Patent No.: US 10,089,429 B2
(45) Date of Patent: Oct. 2, 2018

(54) METHOD AND SYSTEM FOR VERIFYING PRINTED CIRCUIT BOARD DESIGNS, AND CREATING OR VERIFYING RELATED ELECTRONIC COMPONENT PLACEMENT DATA FOR PRINTED CIRCUIT BOARD FABRICATION AND ASSEMBLY

(71) Applicant: Altium LLC, La Jolla, CA (US)

(72) Inventors: Jonathan Hirschman, Brooklyn, NY (US); Petro Bakhirev, Brooklyn, NY (US); James Graham, Brooklyn, NY (US)

(73) Assignee: ALTIUM LLC, La Jolla, CA (US)

( * ) Notice: Subject to any disclaimer, the term of this patent is extended or adjusted under 35 U.S.C. 154(b) by 0 days.

(21) Appl. No.: 14/587,870

(22) Filed: Dec. 31, 2014

(65) Prior Publication Data
US 2015/0302130 A1 Oct. 22, 2015

Related U.S. Application Data

(60) Provisional application No. 61/922,106, filed on Dec. 31, 2013.

(51) Int. Cl.
*G06F 17/50* (2006.01)
*G06F 3/0482* (2013.01)
*G06F 3/0484* (2013.01)
*H05K 3/00* (2006.01)

(52) U.S. Cl.
CPC ........ *G06F 17/5072* (2013.01); *G06F 3/0482* (2013.01); *G06F 3/04842* (2013.01); *G06F 3/04847* (2013.01); *G06F 17/5081* (2013.01); *H05K 3/0005* (2013.01)

(58) Field of Classification Search
CPC .................................................. G06F 17/5072
USPC ........................................................ 716/137
See application file for complete search history.

(56) References Cited

U.S. PATENT DOCUMENTS

| | | | |
|---|---|---|---|
| 6,041,268 A * | 3/2000 | Jin | 700/107 |
| 6,195,618 B1 * | 2/2001 | Rosenberg et al. | 702/152 |
| 6,983,278 B1 * | 1/2006 | Yu et al. | |
| 6,999,965 B1 * | 2/2006 | Cesarotti et al. | |
| 2002/0188910 A1 | 12/2002 | Zizzo | |
| 2005/0086616 A1 | 4/2005 | Wang et al. | |
| 2006/0053341 A1 * | 3/2006 | Haarberg et al. | 714/34 |
| 2007/0250800 A1 | 10/2007 | Keswick | |
| 2011/0066992 A1 * | 3/2011 | Sandy et al. | 716/122 |
| 2013/0083050 A1 | 4/2013 | Yamada | |
| 2013/0326457 A1 * | 12/2013 | MacMunn et al. | 716/122 |
| 2015/0091390 A1 * | 4/2015 | Syal | H05K 1/0268 307/125 |

(Continued)

OTHER PUBLICATIONS

International Search Report, PCT/US2014/073033, dated Jul. 13, 2015, 2 pp.

(Continued)

*Primary Examiner* — Suchin Parihar
(74) *Attorney, Agent, or Firm* — Edward Ryan, Esq.

(57) ABSTRACT

A system for printed circuit board assembly includes a user interface provided on a display device for visual verification of printed circuit board design data, a user interface provided on the display device for inputting bill of material information, and a user interface provided on the display device for verification, alteration and creation of component placement data.

14 Claims, 12 Drawing Sheets

(56) References Cited

U.S. PATENT DOCUMENTS

2015/0128102 A1\* 5/2015 Perry et al. .................. 716/137

OTHER PUBLICATIONS

Written Opinion of the International Searching Authority, PCT/US2014/073033, dated Jul. 13, 2015, 6 pp.
MacroFab, Inc. (@MacroFab) | Twitter, twitter.com/macrofab/status/560909854210924544, Nov. 27, 2013-Oct. 27, 2015, retrieved Oct. 27, 2015, 29 pp.

\* cited by examiner

100

200 http://www.pcb.ng

| Order Info | Create BOM | ify PCB | Placements | e-Order |

Instructions: Add or Verify Each BOM Line     515

BOM

| RefDes | Vendor | Part Number | Description | Footprint |

525 — U1 | -- | Please select component | Please select component | 520
     530    535
[Pick Component]  ☐ Approve U2 | -- | Please select component | Please select component
[Pick Component]  ☐ Approve D1 | -- | Please select component | Please select component
[Pick Component]  ☐ Approve 540
[Add another BOM item]

METHOD AND SYSTEM FOR VERIFYING PRINTED CIRCUIT BOARD DESIGNS, AND CREATING OR VERIFYING RELATED ELECTRONIC COMPONENT PLACEMENT DATA FOR PRINTED CIRCUIT BOARD FABRICATION AND ASSEMBLY

BACKGROUND

Printed circuit board ("PCB") designs can be created and/or edited employing electronic design automation software ("EDA") such as ALTIUM DESIGNER®, CADSOFT EAGLE PCB®, or KICAD. PCB designs are typically stored as digital files residing on a storage medium of a computer (for example, a hard drive). EDA software can also translate PCB design data to industry-standard digital formats, most commonly in RS-274X Gerber format accompanied by Excellon formatted files for drilling-related data. A PCB design may be described by a collection of such files, and such a collection is typically referred to as the "Gerbers" or "the Gerber files" for that design. RS-274X Gerber and Excellon format files are well defined, documented and standardized.

Some EDA software may also allow the user to export additional data, such as the components included in the bill of materials of the finished design ("BOM"), and the coordinate and orientation data required to physically place electronic components on a PCB (variously referred to as "XYRS" (XY Rotation and Side), "Centroid" and "Pick And Place" files). Unlike RS-274X and Excellon files, there is no standardization or canonical definition of BOM and XYRS files.

When a customer wishes to have a PCB created by a PCB fabricator, or to purchase PCB assembly (i.e., the placement and fixation of electronic components upon a PCB) services ("PCBA"), the customer need not physically transport various files to a PCB fabricator or PCBA vendor and instead can electronically transmit the files to an "online" vendor using a computer network such as the Internet. For example, the customer can use an Internet browser program (referred to herein as the "user-agent") such as INTERNET EXPLORER® or MOZILLA FIREFOX®. The customer can direct the user-agent to an Internet-connected server associated with the vendor and upload the design data to that server. The vendor can take the design data and create PCBs and/or assemble components upon finished PCBs. In some cases, customers may use a delivery service such as the UNITED STATES POSTAL SERVICE to deliver previously finished PCBs to a PCBA vendor for assembly services.

In recent years, there has been a tremendous proliferation of computers connected to a global network known as the Internet. The Internet provides a transport mechanism through standardized communication protocols, such as the Hypertext Transport Protocol (HTTP), for communicating web content in the form of text, graphics, sounds, animations, video, and computer executable code.

An internet browser is a client application or operating system utility that communicates with server computers via FTP, HTTP, and Gopher protocols. Examples of popular web browsers include INTERNET EXPLORER®, by Microsoft Corporation, of Redmond, Wash., and FIREFOX™, by Mozilla Corporation, of Mountain View, Calif. Web browsers conventionally receive electronic documents from the network and present them to a user. In addition to being able to display text, web browsers are also typically able to display graphics and other multimedia content (e.g., video, audio, vector graphics, and vector graphic animations). Electronic documents may include text documents, conventional markup documents (e.g. HTML, XML, and others), graphics and other multimedia content, data files, and code that can be executed or interpreted by the web browser or other system components.

In addition to data and metadata, HTML documents can contain embedded software components containing program code that perform a wide variety of operations. These software components expand the interactive ability of an HTML document's user interface. JAVASCRIPT™ scripts are examples of software components that are embedded in HTML documents. A browser executes such software components as it reaches the position in the script during interpretation of the HTML document. Scripts loaded during interpretation of the document may modify the document if the browser supports dynamic HTML (DHTML). Scripts may respond to user activity (pointer events or keyboard events), may post data to the server, and may request and receive data from the server. In recent years, Graphical User Interfaces (GUIs) have been implemented inside of web browsers using software embedded in electronic documents and transmitted from server to client over the Internet. Such mechanisms can, for example, use JAVASCRIPT and DHTML capabilities, and are well understood by those skilled in the art.

XYRS files may reference data variously known as "footprint," "land pattern" or "component" data and generally may specify where the centroid of a land pattern may be placed. Footprint data describes, at the least, the geometry and physical center of an electronic component. Footprint data may be derived from a variety of sources. In some cases, footprint data may be created by the electronic component vendor, the user of the EDA software, or the creator of the EDA software. In some cases, footprint data may be derived from other users, for example, via electronic communities, file-sharing sites, or other "crowdsourcing" methods.

PCBA vendors also use footprint data in their production processes. This data may be created by the PCBA vendor, or by the manufacturer of the PCBA production equipment, or purchased from a specialized data provider, or a combination of all three. It is not unlikely that a PCBA vendor's footprint data will not match a customer's footprint data for a given component.

XYRS data does not include component geometry, aside from the physical center of an electronic component which may be derived from land pattern data from EDA software.

As described above, PCB design files can be uploaded to an online PCBA service. However, the XYRS files are often faulty. Files may be faulty due to the non-standardized nature of XYRS files, or they may incorporate footprint data that, while it may be suitable for certain purposes, is defective for others. For example, footprints with incorrect physical center data will allow for the successful fabrication of PCBs, but not for the successful assembly of the same PCB. In some cases, EDA software does not support creation of an XYRS file. As described above, the footprint data employed by the vendor may differ from that being employed by the user. Unfortunately, the lack of common XYRS files, the lack of a generally accepted file formats, the differences between user and vendor footprint data, and the high defect rates associated with XYRS data often requires PCBA vendors to manually create, or re-create, XYRS data from the PCB itself (a process called "footprinting" or "teach-in"). For most PCBA vendors, the lack of reliable XYRS data is so common that manual footprinting is an established routine, and user XYRS data is either discarded or not accepted.

As described above, PCB design files can be uploaded to an online PCBA service. Again, as with the XYRS files, BOM files are often faulty. Files may be faulty due to the non-standardized nature of BOM files, or in the case of customers providing their own components to a PCBA vendor, the actual components may not match the information in the BOM file.

From the perspective of the PCBA vendor, this lack of predictably reliable XYRS and BOM data is not desirable. Predictably reliable XYRS data would allow a vendor to greatly automate the assembly process, improving profitability and delivery times, but the issues with XYRS data, as described above, means that most vendors find it more efficient to perform manual footprinting. Footprinting is performed on the same equipment that is more profitably used for actual PCBA production, and due to the manual nature of footprinting, may introduce production errors. Unreliable BOM data also increases the potential for errors, and increases support costs for the vendor.

From the perspective of the PCBA service customer, this lack of reliable XYRS and BOM data increases their costs and lead-time to receive finished product, and increases the likelihood of errors. Additionally, it may also increase their labor costs, as faulty data may be returned to the customer by the PCBA vendor for review and correction.

The present inventors have recognized that it would be advantageous to provide users with a way to order PCBA services that disallows the possibility of submitting faulty XYRS and BOM data. What is desired is a system that provides the tools and features required for a user to both upload their PCB design data, and to verify and/or input XYRS and BOM data visually. In addition, the system should allow users to associate components in the users' BOM with verified footprint data from a single source, and use the same footprint data for visual verification or creation of XYRS data.

SUMMARY

Accordingly, the disclosed embodiments are directed to providing a system which can load printed circuit board design data onto a server for purposes of fabricating and assembling printed circuit boards.

The disclosed embodiments are also directed to allowing the creation of a listing of components, sometimes referred to as a bill of materials, for inclusion in the assembly of printed circuit boards.

The disclosed embodiments are further directed to allowing the creation of component positioning data, sometimes referred to as XYRS data, for use in the assembly of printed circuit boards.

Other objects will be obvious and will appear hereinafter. The disclosed embodiments are at least directed to providing an article of manufacture as exemplified in the following summary and detailed description.

The disclosed embodiments are directed to a system and method for processing electronic PCB design data and associated user input as part of an online ordering system. The system comprises at least one server computer connected to a network. The server is adapted to receive electronic PCB design data and associated user input from a second computer connected to the network. The server processes the electronic PCB data and creates a display containing at least a portion of the processed electronic PCB data. The data representing the display is in a format that allows for transmission to and viewing on a client computer. Viewing on the client computer is preferably accomplished with a graphical user-agent such as a web browser. The server is also adapted to send notifications regarding an order process to at least one person via the network.

Data for processing electronic PCB design data may also be provided in part from a database containing geometries for electronic components to be employed in PCB assembly.

The disclosed embodiments are also directed to a system for printed circuit board assembly including a user interface provided on a display device for visual verification of printed circuit board design data, a user interface provided on the display device for inputting bill of material information, and a user interface provided on the display device for verification, alteration and creation of component placement data.

According to some aspect of the disclosed embodiments, the user interface for visual verification of printed circuit board design data includes an image map of a printed circuit board design, and navigation controls for creating zoomed and panned views of the image map, for reviewing and approving the printed circuit board design.

In some aspects of the disclosed embodiments, the image map includes a visual representation of the printed circuit board design and each layer of the printed circuit board design as will be manufactured.

In certain aspects of the disclosed embodiments, the image map is created from a transformation matrix determined from a coordinate system derived from the printed circuit board design data and characteristics of the user interface for visual verification of printed circuit board design data.

In at least one aspect of the disclosed embodiments, the user interface for inputting bill of material information includes a display for inputting the bill of material information, a display for searching for components to be added to the bill of material information, and a display for showing a visual representation of each component.

In one or more aspects of the disclosed embodiments, the user interface for verification, alteration and creation of component placement data includes an image map of a printed circuit board design, and a control for adding at least one footprint sprite overlay to at least a portion of the image map.

In some aspects of the disclosed embodiments, the user interface for verification, alteration and creation of component placement data includes an image map of a printed circuit board design, and controls for adjusting a rotation and coordinates of a footprint sprite overlay on the image map.

In certain aspect of the disclosed embodiments, the user interface for verification, alteration and creation of component placement data includes an image map of a printed circuit board design, and a control for approving a footprint sprite overlay on the image map as being correctly positioned.

The disclosed embodiments are further directed to a method including providing a user interface on a display device for visual verification of printed circuit board design data, providing a user interface on the display device for inputting bill of material information, and providing a user interface on the display device for verification, alteration and creation of component placement data.

Some aspects of the disclosed embodiments include displaying an image map of a printed circuit board design in the user interface for visual verification of printed circuit board design data, and creating zoomed and panned views of the image map, for reviewing and approving the printed circuit board design.

Other aspects of the disclosed embodiments are directed to including a visual representation of the printed circuit board design and each layer of the printed circuit board design as will be manufactured within the image map.

Certain aspects of the disclosed embodiments include creating the image map from a transformation matrix determined from a coordinate system derived from the printed circuit board design data and characteristics of the user interface for visual verification of printed circuit board design data.

At least one aspect of the disclosed embodiments includes using the user interface for inputting bill of material information for inputting the bill of material information, searching for components to be added to the bill of material information, and showing a visual representation of each component.

One or more aspects of the disclosed embodiments include using the user interface for verification, alteration and creation of component placement data for displaying an image map of a printed circuit board design, and adding at least one footprint sprite overlay to at least a portion of the image map.

Some aspects of the disclosed embodiments provide for using the user interface for verification, alteration and creation of component placement data for displaying an image map of a printed circuit board design, and adjusting a rotation and coordinates of a footprint sprite overlay on the image map.

Additional aspects of the disclosed embodiments include using the user interface for verification, alteration and creation of component placement data for displaying an image map of a printed circuit board design, and approving a footprint sprite overlay on the image map as being correctly positioned.

The above mentioned objectives of the disclosed embodiments will become more apparent and the embodiments themselves better understood with reference to the following description in conjunction with the accompanying drawings.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings:

FIGS. 5A, 5B, 5C and 6 are exemplary screenshots related to the process of FIG. 3.

DETAILED DESCRIPTION

Figure 1:
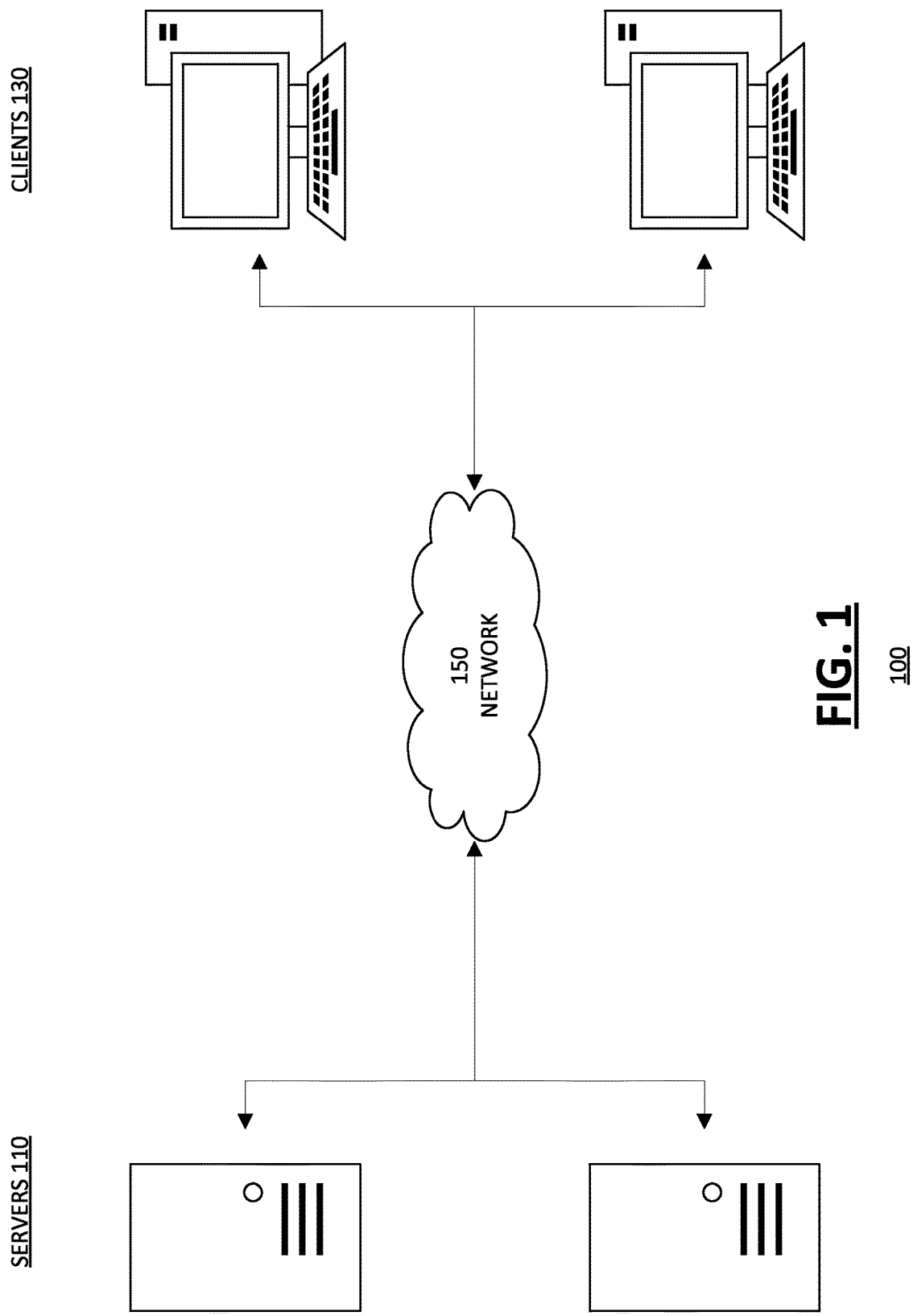
FIG. 1 is a block diagram generally representing a computer system into which the disclosed embodiments may be incorporated.

It is believed that the disclosed embodiments will be better understood from a consideration of the following description in conjunction with the drawing figure(s).

In the following detailed description, numerous specific details are set forth to provide a full understanding of the present disclosure. It will be apparent, however, to one ordinarily skilled in the art that the embodiments of the present disclosure may be practiced without some of these specific details. In other instances, well-known structures and techniques have not been shown in detail so as not to obscure the disclosure.

FIG. 1 is a block diagram generally representing a computer system into which the disclosed embodiments may be incorporated. The architecture 100 includes servers 110 and clients 130 connected over a network 150. For example and without limitation thereto, the system of the disclosed embodiments can find application in public as well as private networks, such as closed systems, or private company networks.

Figure 2:
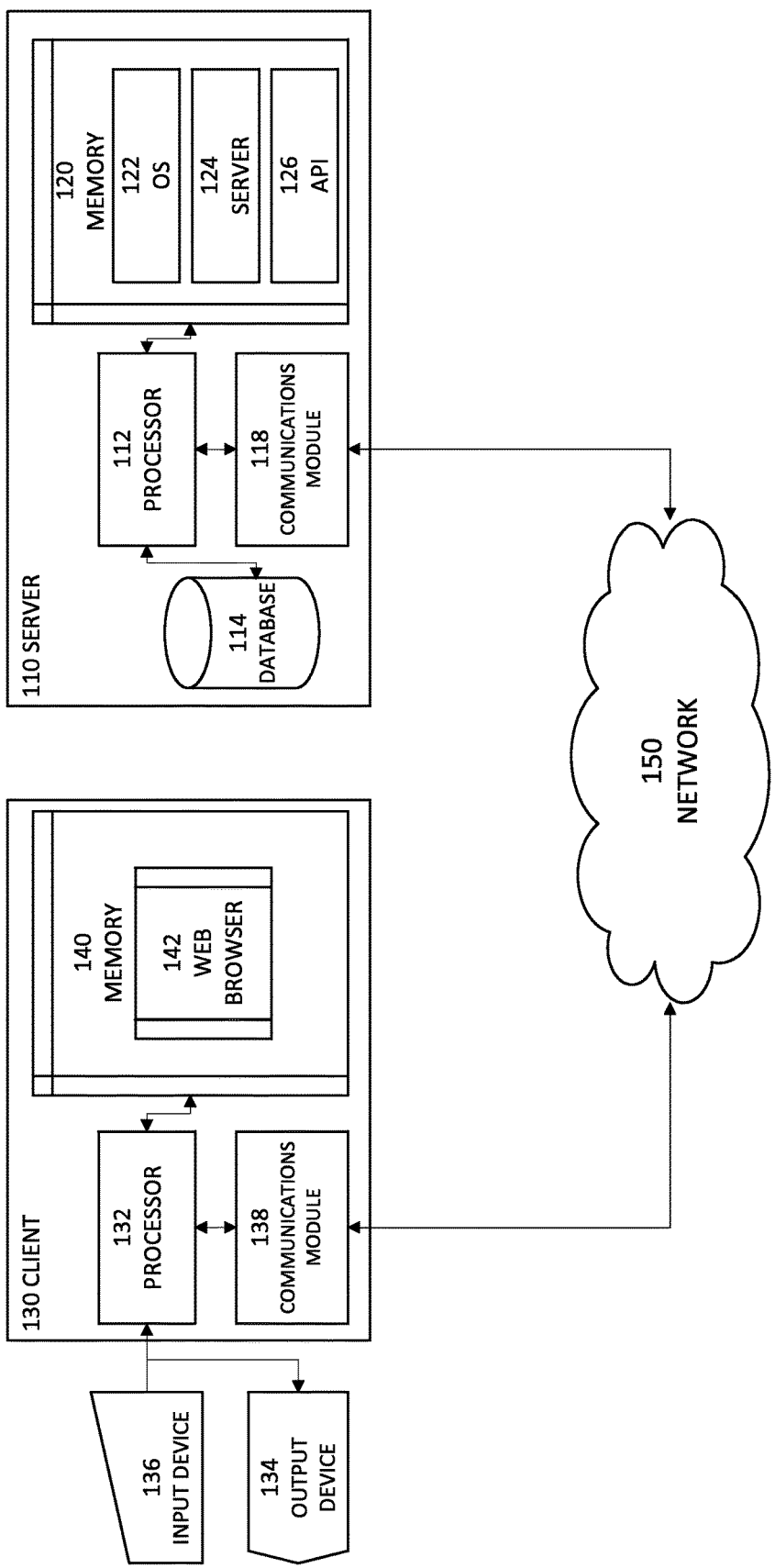
FIG. 2 is a block diagram of server and client computer as found in FIG. 1, illustrating a portion of the functions utilized by the disclosed embodiments.

FIG. 2 is a block diagram 200 illustrating an exemplary server 110 and client 130 in the architecture 100 of FIG. 1 according to certain aspects of the disclosure. One of many clients 130 and one of many servers 110 are connected over the network 150 via respective communications modules of 138 and 118. The communications modules 138 and 118 are configured to interface with network 150 to send and receive information, such as data, requests, responses and commands to other devices on the network. The communications modules 138 and 118 can be, for example, modems or Ethernet cards.

Clients 130 include a processor 132, the communications module 138, and a memory 140 that includes a web browser, also referred to as a User Agent 142. Clients may be any device capable of presenting data, including, but not limited to, computers, cellular telephones, networked television sets, personal digital assistants, etc. The servers 110 can be any device having an appropriate processor 112, memory 120 and communications capability for hosting application server 124. The memory 120 generally includes a computer readable medium storing computer readable program code for carrying out and executing the techniques and processes described herein when executed by the processor 112.

In at least one of the disclosed embodiments, application server 124 is a system that sends out Web pages in response to Hypertext Transfer Protocol (HTTP) requests from browser 142. That is, the application server provides the graphical user interface to users in the form of Web pages. The Web pages sent to client 130 would result in graphical interface screens that include various tools to enter information, manipulate graphical objects in the graphical interface, etc.

Database 114 stores software, geometry data for components, system data, order data, state data and any other data required by the components of the apparatus. The database may be provided, for example, as a database management system, an object-oriented database management system, a relational database management system, a file system, another conventional database package, or a combination of such systems. Further, the database 114 can be accessed via a Structured Query Language (SQL) or other tools known to one of ordinary skill in the art.

Figure 3:
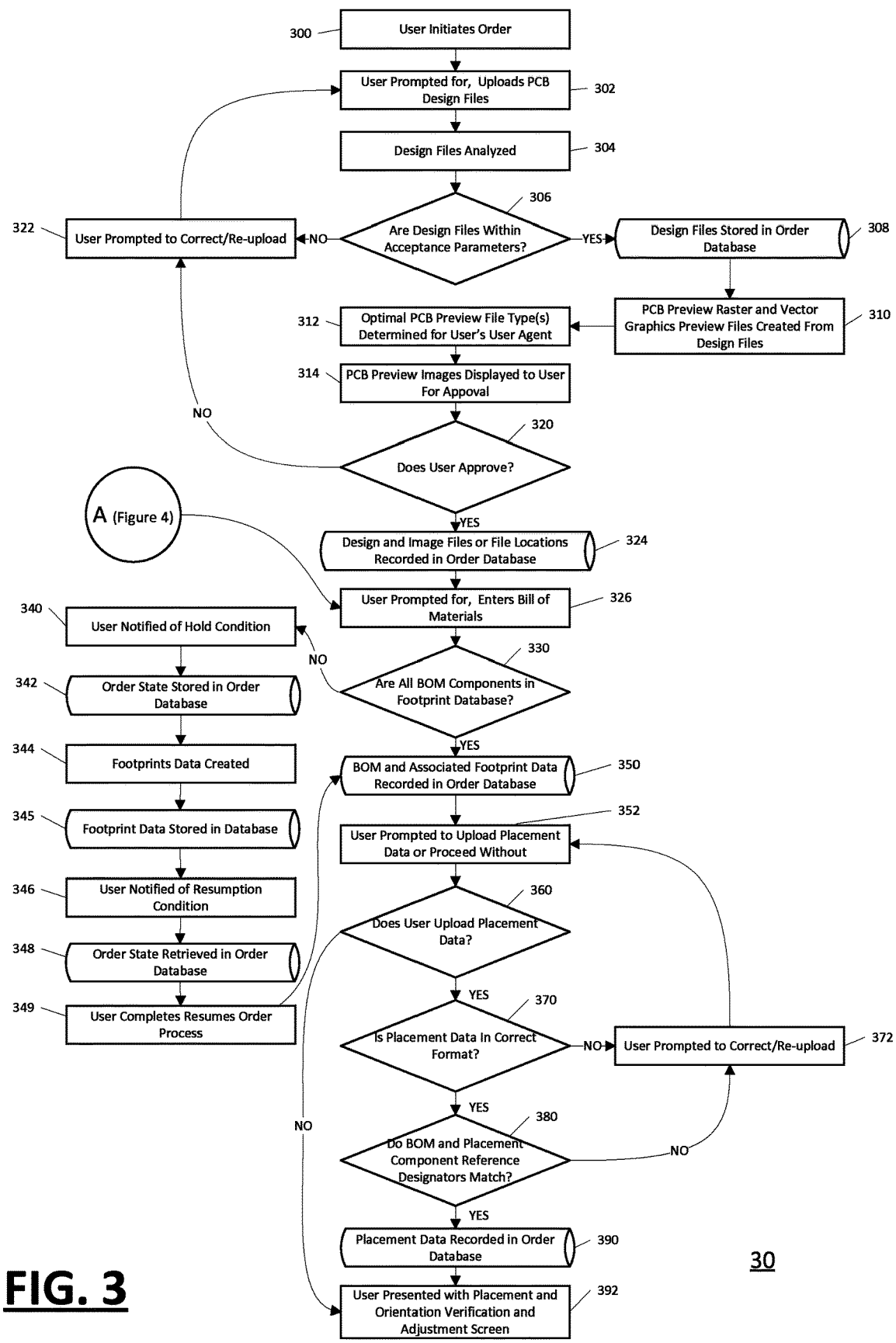
FIG. 3 is a flowchart generally representing an exemplary process of the disclosed embodiments using the exemplary servers and clients of FIG. 2.

FIG. 3 is a flowchart generally representing an exemplary process of the disclosed embodiments using the exemplary servers and clients of FIG. 2. The sample process 30 may be performed by a processing logic contained within application server 124, by browser 142, or a combination of both. Referring to FIG. 3, at block 300 a user employing client 130 initiates an order process on server 110. As part of the order process, at block 302 the user is prompted to upload PCB design files via a notification in browser 142. In at least one of the disclosed embodiments, the design files are uploaded via a standard Web browser file upload form. The files, received by server 110, are analyzed at block 304 by application server 124 to determine if the files have the correct format and generally meet various assembly specifications. If, at block 306, the uploaded files are found to be outside of predetermined acceptance parameters, processing logic may proceed to block 322, where the user is notified via on-screen message to correct their design files and resubmit, and logic then returns to block 302.

If the user's files are found to be within predetermined acceptance parameters, processing logic may proceed to block 308. At block 308, the user's design information is stored in database 114. Processing logic proceeds to block 310, where the data from the user's uploaded files are converted by application server 124 into graphical representations 610, 620 (FIG. 6) of the uploaded PCB design data. These representations may be in raster format (e.g., PNG, JPG), or in vector format (e.g., SVG, PDF), or in multiple formats suitable for display by client browser 142. Logic proceeds to block 312, where techniques known to one of ordinary skill in the art are employed to determine the optimal graphical file types for display within client browser 142. Logic proceeds to block 314 wherein the graphical representations of the user PCB design data are displayed by client 130 as illustrated in exemplary screenshot 600 (FIG. 6), according to the disclosed embodiments. In block 320, the user is provided with an opportunity to approve the graphical representations, where the user is presented with option 640 (FIG. 6) to approve the graphical representation of their PCB design data, or with option 650 (FIG. 6) to decline and resubmit their PCB design data. If the user declines, processing logic proceeds to block 322, where the user is notified via on-screen message to correct their design files and resubmit.

Upon approval by the user, logic proceeds to block 324, and the user's design file data and image files are stored in database 114. Logic proceeds to block 326, and the user is prompted to enter their BOM data, as illustrated in exemplary screenshot 500 (FIG. 5A), according to the disclosed embodiments. In another embodiment, BOM data may be simply submitted as a text file via a simple Web form.

After the user submits their BOM data, logic proceeds to block 330. The user's BOM data is compared to electronic component footprint data, i.e., component geometries, and if all items in the user's BOM data do not correspond to existing footprint data previously stored in database 114 (for example, licensed from a footprint vendor, or supplied by component vendors), logic proceeds to block 340. The user is notified with an on-screen message at block 340, notifying of a "hold" condition. Logic proceeds to block 342, and the entire session/data state is stored in database 114.

Logic proceeds to block 344, wherein any missing footprint data is created either manually or automatically. Footprint data created in block 344 is stored in database 114 as logic proceeds to block 345. Logic then proceeds to block 346, where the user is notified that their order process may be resumed. In one or more of the disclosed embodiments, this may be via email, on-screen messaging, or other electronic messaging service. The notification may, in at least one embodiment, include a Uniform Resource Location (URL) hyperlink that includes encoded information that corresponds to the state information saved at block 342. The user may employ such a hyperlink, or other navigational method, to resume the order process in block 349, having had their order state recreated from data retrieved in block 348 from database 114.

Logic proceeds to block 350, wherein the current BOM and associated footprint data are saved to database 114. Logic then proceeds to block 352, where the user is presented with an on-screen option, according to the disclosed embodiments, to either upload XYRS data via Web form, or to proceed without such data. Logic proceeds to block 360. If the user elected to, and uploaded XYRS data, the files received by server 110 are analyzed at block 370 by application server 124. If, at block 370, the uploaded files are found to be outside of predetermined acceptance parameters, processing logic may proceed to block 372, where the user is notified via on-screen message to correct their XYRS data and resubmit at block 352, or to elect to proceed without XYRS data. If, at block 370, the uploaded files are found to be within predetermined acceptance parameters, logic proceeds to block 380, and the XYRS data is compared to the BOM data submitted at block 326 to ensure that both sets of data correspond in terms of the naming of each electronic component ("Reference Designators"). If both sets of data do not correspond, logic may proceed to block 372, where the user is notified via on-screen message to correct their XYRS data and resubmit at block 352, or to elect to proceed without XYRS data.

If the user, at block 352, elects to proceed without XYRS data, or if the user submitted XYRS data that was found to be within acceptance parameters at block 370 and matched the Reference Designators at block 380, logic proceeds to block 390. XYRS data, if any, is recorded in database 114 at block 390. Logic then proceeds to block 392, where the user is presented with a graphical interface that allows for placement, orientation verification, or adjustment of the component placement, as illustrated in exemplary screenshot 700 (FIG. 7A), following an exemplary process represented by sample process 40 (FIG. 4) according to the disclosed embodiments. If the user, at block 352, has elected to proceed without XYRS data, in some embodiments, the system may attempt to place the component before proceeding to the graphical interface illustrated by exemplary screenshot 700.

Figure 4:
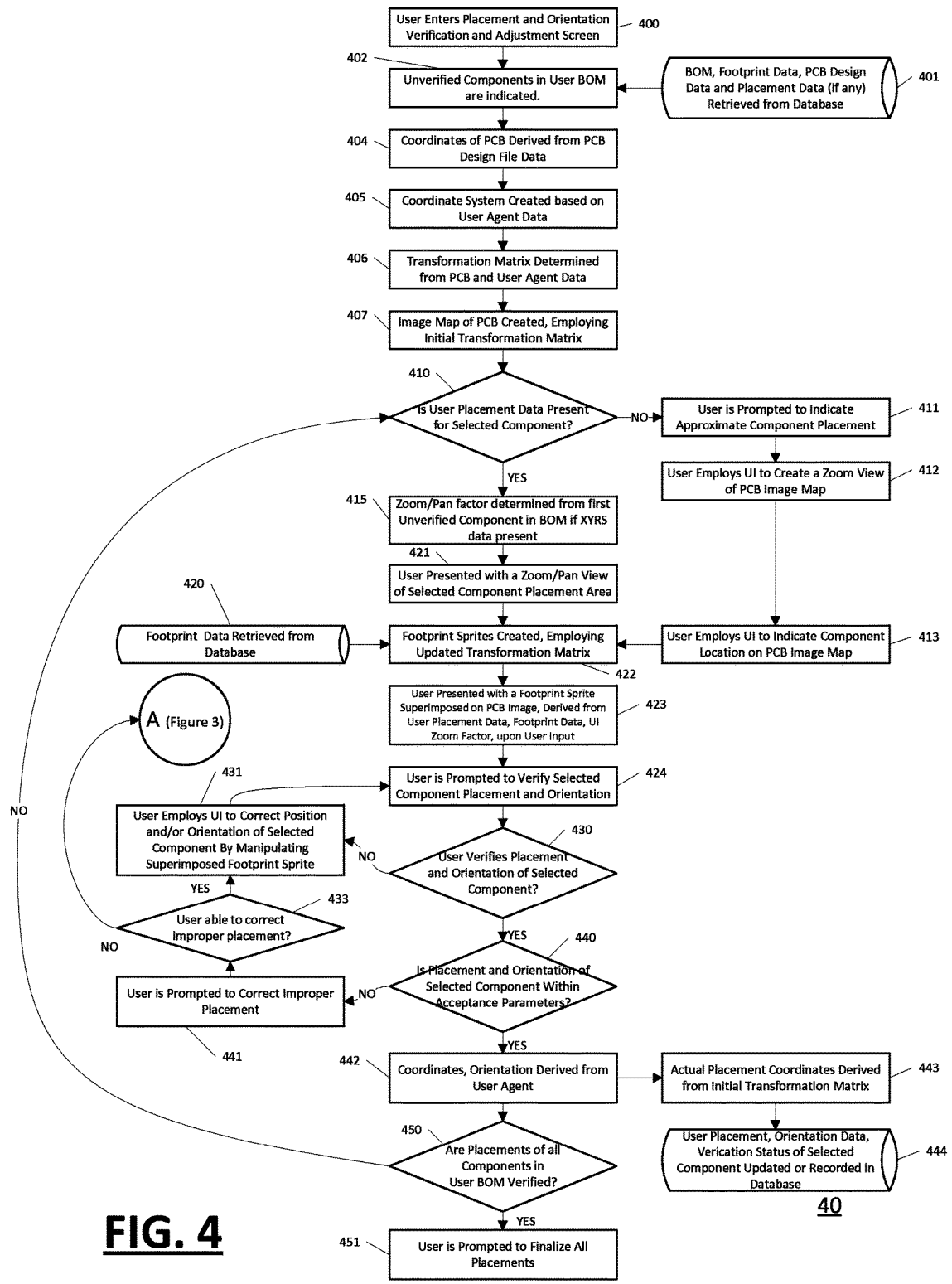
FIG. 4 is a flowchart generally representing an exemplary process of the disclosed embodiments using the exemplary servers and clients of FIG. 2.

FIG. 4 is a flowchart generally representing an exemplary process for verification and/or creation of XYRS data for component placements for PCB assembly using the exemplary servers and clients of FIG. 2. The sample process 40 may be performed by a processing logic contained within application server 124, by browser 142, or a combination of both.

Figure 7A:
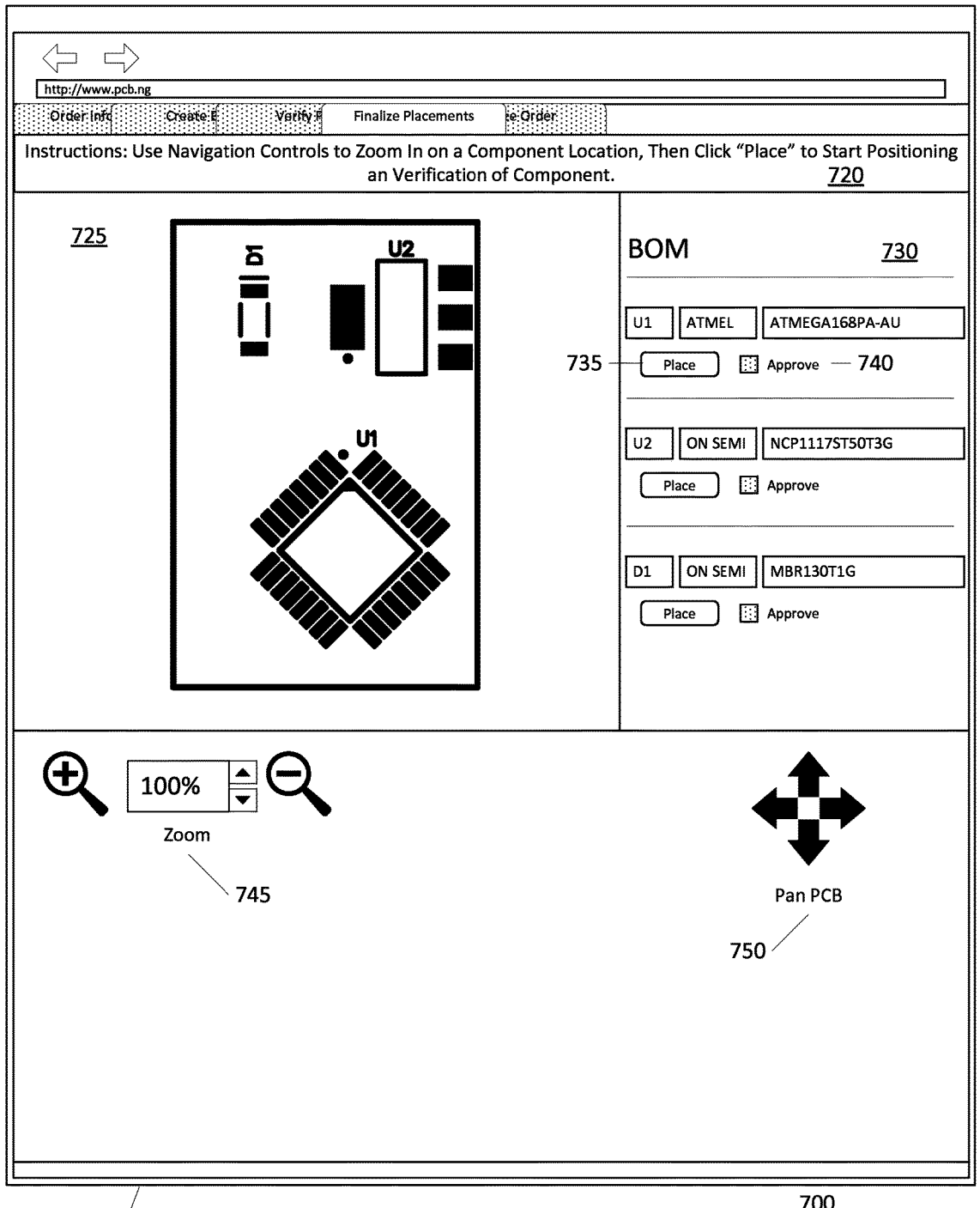
FIGS. 7A, 7B, 7C and 7D are exemplary screenshots related to the process of FIG. 4.

Referring to FIG. 4, at block 401, data previously uploaded by the user (BOM, PCB design and, if the user elected at block 350 (FIG. 3), XYRS data), as well as footprint data, is retrieved from database 114 and employed by application server 124 to render a GUI that is transmitted to client 130 to create an interface, as illustrated in exemplary screenshot 700 (FIG. 7A). Logic proceeds to block 402, and the user is presented with components in their BOM displayed as verified or unverified, for example, as a GUI checkbox that is unchecked when a given component is unverified, illustrated by item 740 (FIG. 7A). "Unverified", according to the disclosed embodiments, is defined to mean that the end user has not approved the placement data of a given component.

Logic proceeds to block 404, where a coordinate system is derived from the PCB design data stored in database 114. Such a coordinate system may be created by operations within one or more of the server 110 and user agent 142 (FIG. 2). Logic proceeds to block 405, where a coordinate system is derived from characteristics of the user agent 142. Logic proceeds to block 406, where a transformation matrix is determined from the derived coordinate systems from the PCB design data and User Agent characteristics. At 407, an image map, derived from the user's PCB design data, is created by application server 124, employing the transformation matrix created at block 406, and presented as illustrated by item 725 (FIG. 7A). The image map may, for example, be a single image map, or a scalable vector image corresponding to the transformation matrix and displayed by the browser 142.

Logic proceeds to block 410, wherein application server 124 determines whether XYRS data is present for each component of the user's BOM. If XYRS data is not present, the user is prompted at block 411 to employ an on-screen GUI, as exemplified by status bar 725 (FIG. 7A), using zoom control 745 and pan control 750 (FIG. 7A) to create a zoom view and to indicate a component location as shown in blocks 412 and 413, respectively. Server application 124 updates the transformation matrix, according to a "zoom factor" and optionally an "offset factor" derived from user input from controls 745 and 750.

If XYRS data is present, logic proceeds to block 415, wherein application server 124 determines an optimal "zoom factor" and an optional "offset factor" based upon the user-submitted coordinates of the first BOM item, and in turn, updates the transformation matrix.

Logic proceeds to block 421, where the image map representation of the user PCB design data is refreshed to reflect the updated transformation matrix. Logic proceeds to block 422, where vector representations of BOM component footprints are created ("sprites"), internally, by application server 124, using footprint data retrieved at block 420 from database 114, and from the current transformation matrix.

Figure 7B:
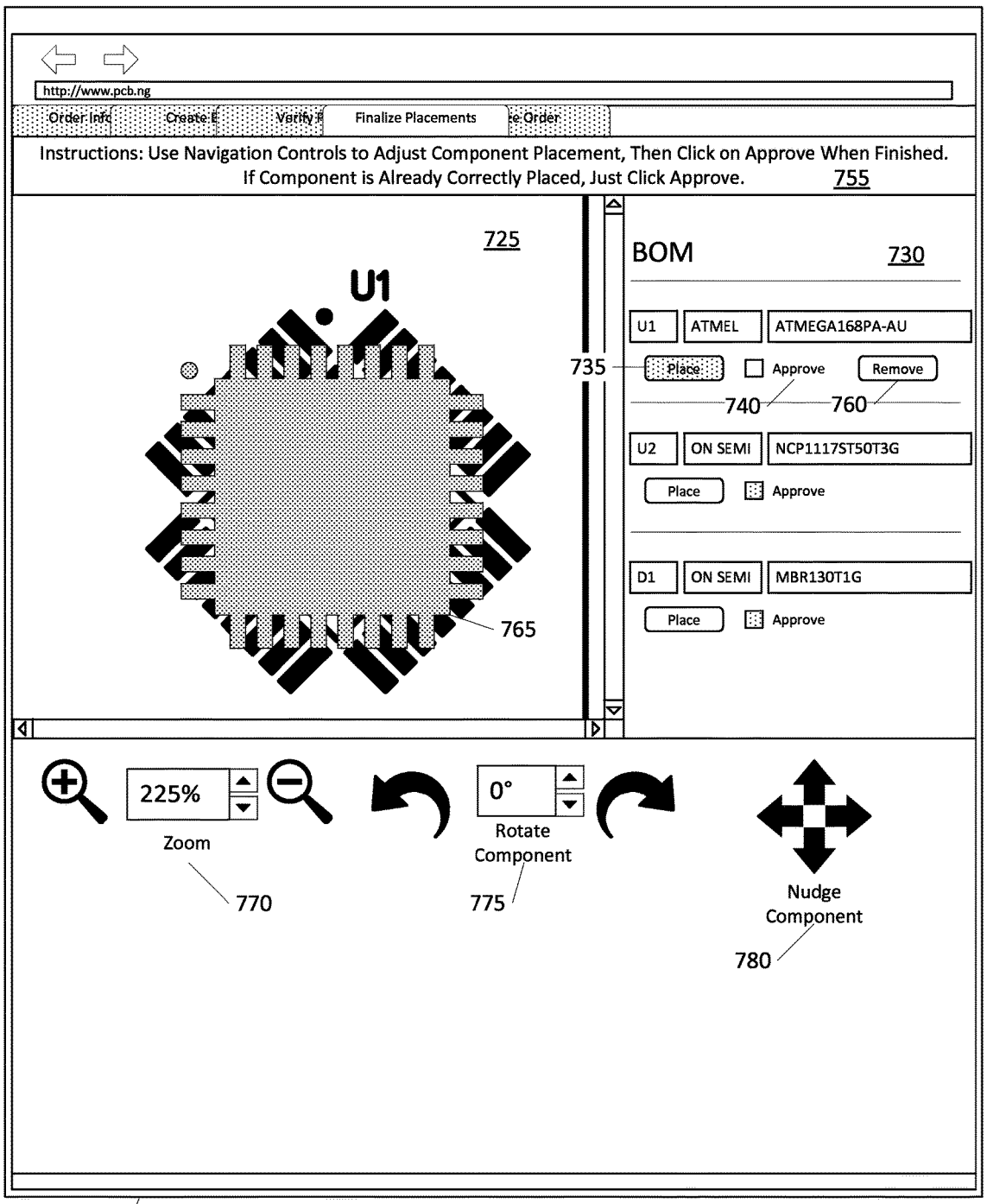

Upon user input, such as the user clicking on a "Place" button, as shown in 735 in exemplary screenshot 700 (FIG. 7A), logic proceeds to block 423. At block 423, application server 124 transmits the footprint sprite associated with the BOM item associated with the Place button, and presents the footprint sprite as illustrated in 765 in exemplary screenshot 705 (FIG. 7B). Logic proceeds to block 424, where the user is prompted to verify the selected component placement via the "Approve" control, as shown in 760 in exemplary screenshot 705 (FIG. 7B). If the user does not verify the placement, logic proceeds to block 431, wherein the user may use on-screen GUI controls to adjust the rotation and coordinates of the footprint, as shown in 770, 775 and 780 in exemplary screenshot 705 (FIG. 7B). If the user does verify the selected component placement via the "Approve" control, logic proceeds to block 440.

At block 440, the current component placement data is analyzed by application server 124. If the current component placement data is found to be outside of predetermined acceptance parameters, processing logic may proceed to block 441, where the user is notified via on-screen message to correct their component placement. If the user is unable to correct the improper placement as shown in block 433, logic proceeds to block 326 in FIG. 3, where the user may enter the selected component again. If the user is able to correct the improper placement as shown in block 433, logic then returns to block 431. If the current component placement data is determined to be within predetermined acceptance parameters, logic proceeds to block 442.

At block 442, the coordinates and orientation of the current component placement are retrieved from User Agent 142 by application server 124. This data is translated back to the original PCB design coordinate system at block 443 using the current transformation matrix. This re-translated coordinate data, and the orientation data, is either written to, or altered in database 114, and marked as verified at block 444. Logic then proceeds to block 450.

At block 450, all components verification status in the user's BOM are queried by application server 124 in database 114. If any components are still marked as unverified, logic passes back to block 410. If all components are marked as verified, logic proceeds to block 451.

Figure 7C:
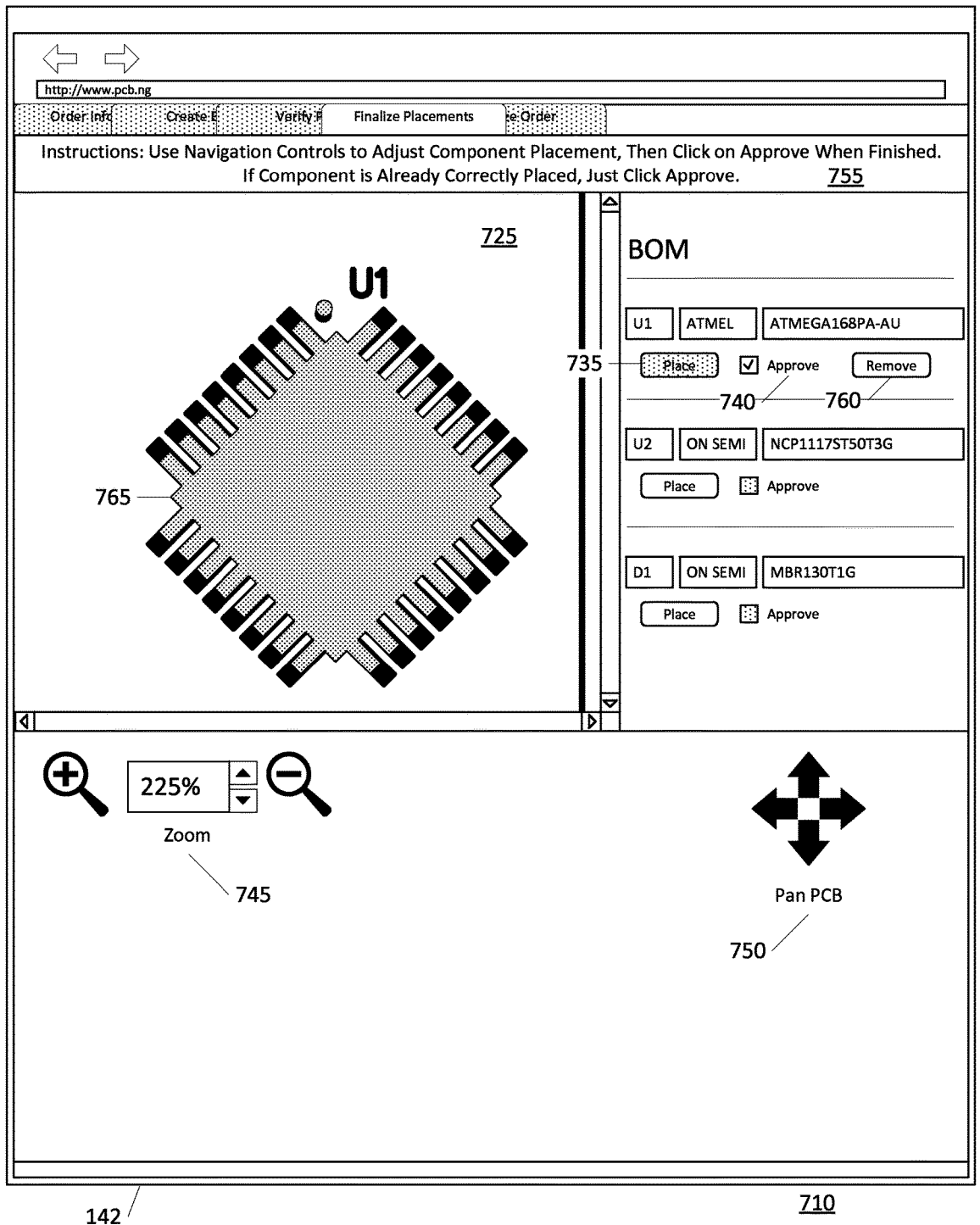
Figure 7D:
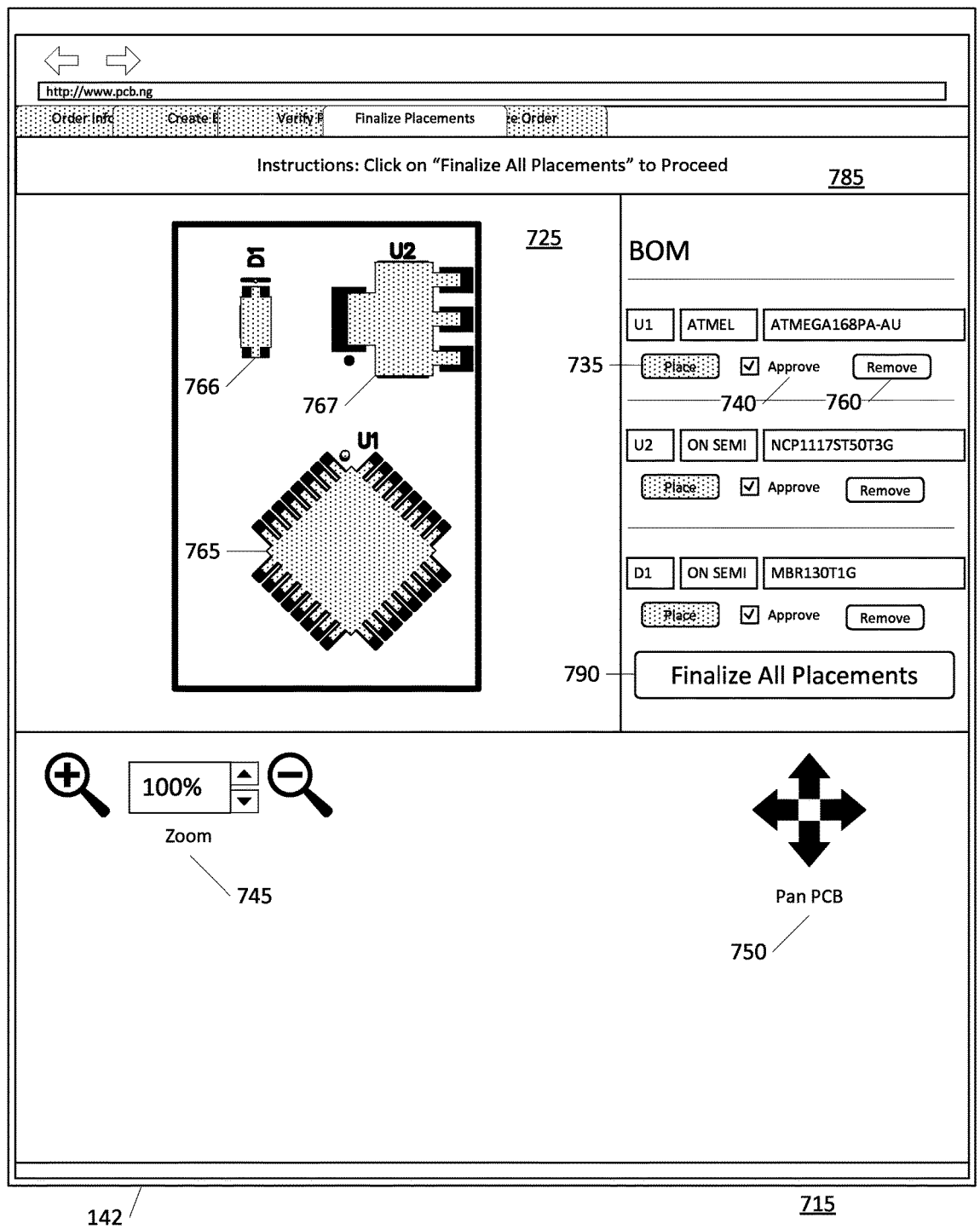

At block 451, the GUI that is transmitted to client 130 by application server 124 is altered to prompt the user to finalize all component placements, as shown in 790 in exemplary screenshot 715 (FIG. 7D). If the user elects to finalize all component placements, the user is then presented with an interface to finalize payment and shipping arrangements for assembled PCBs based on the system and process of the disclosed embodiments.

FIG. 5A illustrates an exemplary screenshot 500 of client user agent 142 of a user interface employed for input of BOM data. Status bar 515 may contain various instructional messages at different stages of the entry process. A component section 520 is displayed for each component listed in user submitted XYRS data; in the case of the user not submitting XYRS data, only one section would be initially appear, and the user may add additional sections by adding them via button 540 according to the disclosed embodiments. Entry field 525 may be pre-populated with component reference designators ("Ref Des") in the case of submitted XYRS data, or the field may be manually populated by the user. In one embodiment, button 530 may be employed to initiate a component search. An approval control 535 is visible but not selectable until a component has been selected by the user.

Figure 5B:
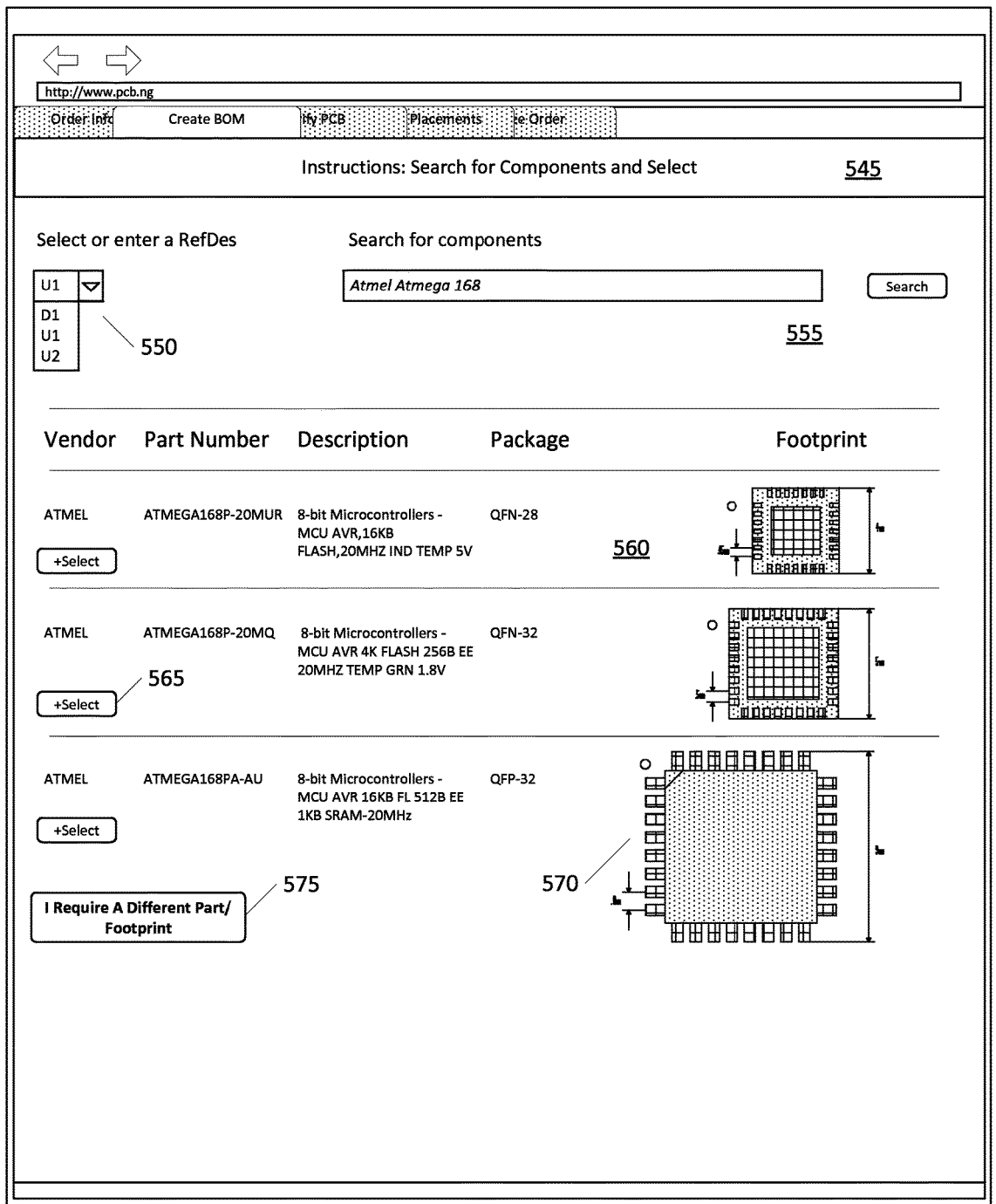

FIG. 5B illustrates an exemplary screenshot 505 of client user agent 142 of a user interface employed for visually and textually searching for an electronic component for purposes of BOM data entry. Status bar 545 may contain various instructional messages at different stages of the search/entry process. Entry field 550 may, according to the disclosed embodiments, allow the user to either select an existing RefDes in the case of user submitted XYRS data, or to enter a new Ref Des entirely. Search controls 555 may include a text entry field and a button for initiating a search on data stored in database 114, by application server 124. Results sections 560 are displayed for each result from the user search, and populated with pertinent data, as well as a visual representation 570 of each component found. According to the disclosed embodiments, visual representation 570 is derived from the same foot print data stored in database 114 as referenced previously. Each section 560 also contains a "Select" button, which selects a given search result for inclusion in the user BOM. In the case of there being no correct search result for the end-user, button 575 may be employed to request additional parts or footprints for inclusion in the user BOM.

Figure 5C:
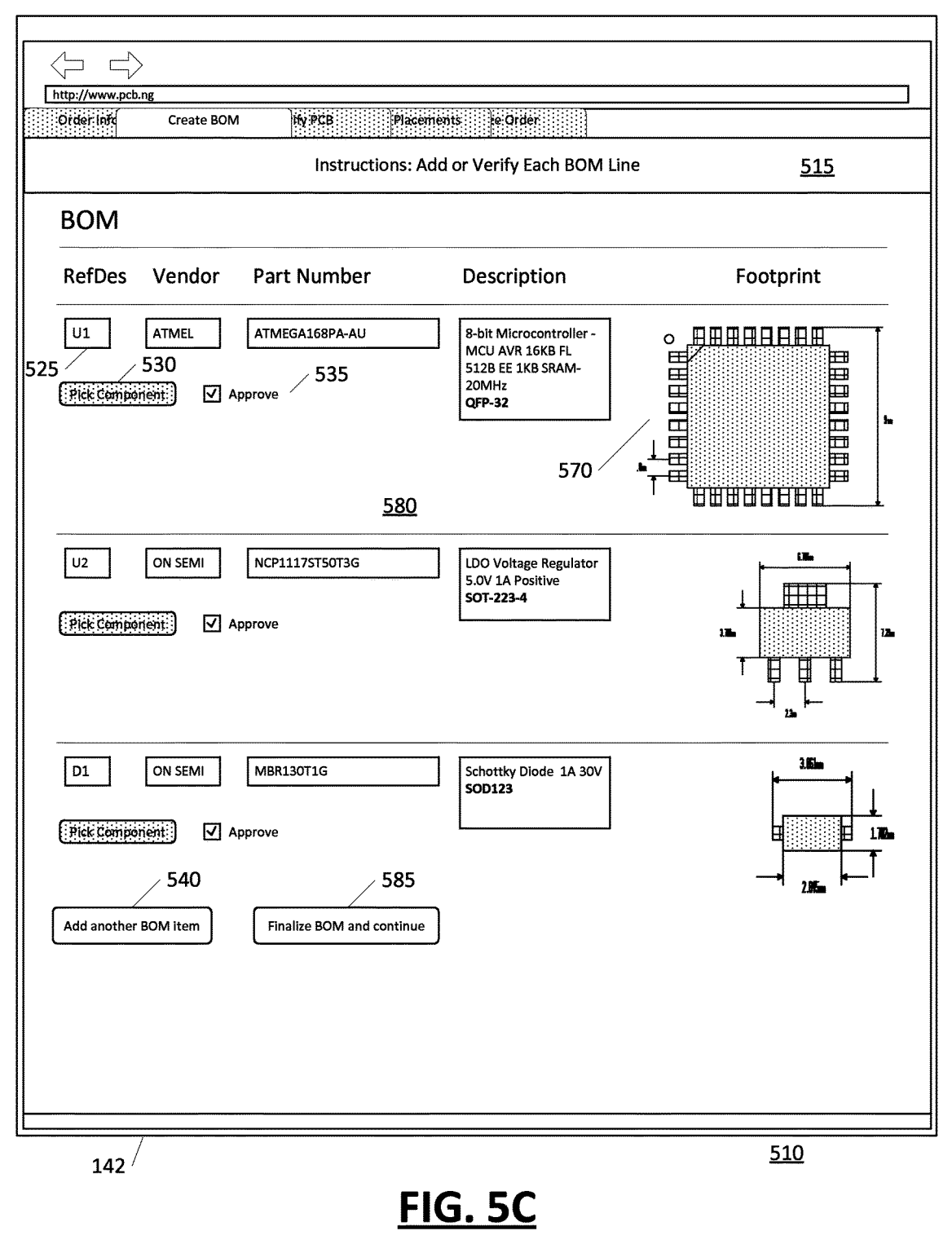

FIG. 5C illustrates an exemplary screenshot 510 of client user agent 142 of a user interface employed for input of BOM data, after multiple components have been selected and approved. As in FIG. 5A, status bar 515 may contain various instructional messages at different stages of the entry process. A component section 580 is displayed for each component that has been previously selected by the user, and, according to the disclosed embodiments, incorporates visual representation 570. Again, as in FIG. 5A, the user may add additional sections by adding them via button 540. Entry field 525 is not alterable unless approval control 535 is de-selected; likewise, button 530 is also no longer active unless approval control 535 is de-selected. Additionally, button 585 is displayed once all components are marked as approved as illustrated in section 580.

Figure 6:
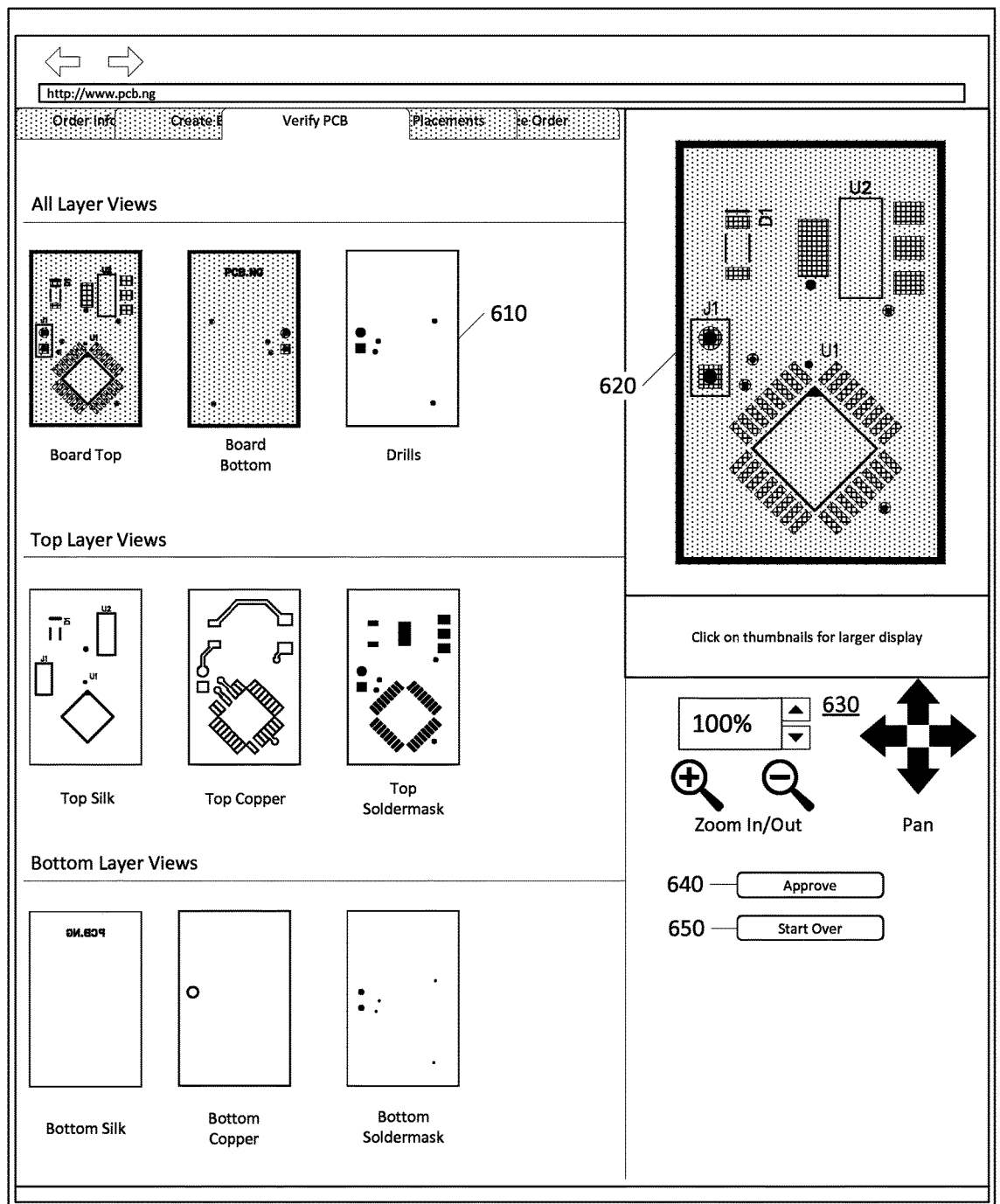

FIG. 6 illustrates an exemplary screenshot 600 of client user agent 142 of a user interface employed for providing a visual verification of user-uploaded PCB design data, according to the disclosed embodiments. Graphical representations 610, created by application server 124, are displayed of each component layer of user submitted PCB design files, as well as composite graphical representations created by merging component graphical representations together. As a result, the graphical representations show a visual representation of each layer of the PCB as will be manufactured, and the entire PCB as will be manufactured. Graphical representations 610 function as a GUI selection control in client user agent 142, according to the disclosed embodiments, and opting to select one will result in image map 620, also created by application 124, updating to correspond with the user's selection. In one aspect of the disclosed embodiments, navigation controls 630 may be employed by the end user to create zoomed and panned views of image map 620, allowing the end user to see the graphical representations at a detailed level. Button 640 may be employed by the user to indicate that the graphical representations of uploaded PCB design files are satisfactory; button 650 may be employed for by the user to indicate disapproval, and for navigation to a user agent based upload page to resubmit PCB design files.

FIG. 7A illustrates an exemplary screenshot 700 of client user agent 142 of a user interface employed for verification, alteration and creation of XYRS data, for purposes of PCB assembly, according to the disclosed embodiments. Status bar 720 may contain various instructional messages at different stages of the entry process. Buttons 735 are employed to allow the user to add a previously described footprint sprite overlaying image map 725. Image map 725 functions as previously described 620; similarly, navigation controls 745 and 750 function similarly to 630 for purpose of zooming and panning image map 725. Unlike 630, controls 745 and 750 are modal, in that they may be employed in another aspect to be described later. Approval controls 740 are employed to allow the user to indicate approval of a component position and orientation, and are configured to be visually and functionally enabled once a corresponding footprint sprite overlay is present. BOM area 730 is derived from user submitted BOM data as previously described.

FIG. 7B illustrates another functional aspect of exemplary screenshot 700 (FIG. 7A) where XYRS data existed but is incorrect and requires adjustment. In exemplary screenshot 705 of client user agent 142, footprint sprite overlay 765 has been added to image map 725 by the user via button 735. According to the disclosed embodiments, several of the controls previously described are modal in nature. Button 735 is visually and functionally altered such that it is disabled after footprint sprite 765 has been added to image map 725. Likewise, corresponding approval control 740 is configured to be visually and functionally available to the user. Button 760 is added to user agent 142 GUI, and may be employed by the user to remove footprint sprite overlay 765 from image map 725.

Controls 745 and 750 (FIG. 7A) are altered in user functionality once a footprint sprite overlay is added to image map 725. They are replaced by controls 770, 775, and 780 which may be employed by the user to alter the position and orientation of footprint sprite overlay 765. This change in functionality is communicated via status bar 755.

FIG. 7C illustrates another functional aspect of exemplary screenshot 700 (FIG. 7A). In exemplary screenshot 710 of client user agent 142, footprint sprite overlay 765 has been approved as being correctly positioned by the user via approval control 740. Controls 770, 775, and 780 (FIG. 7B) are altered in user functionality once the position of a footprint overlay 765 has been indicated as correct by the user via approval control 740, and may be employed as previously described to alter the view of image map 725.

FIG. 7D illustrates another functional aspect of exemplary screenshot 700 (FIG. 7A). In exemplary screenshot 715 of client user agent 142, footprint sprite overlays 765, 766 and 767 have been approved by the user as previously described. Status bar 785 is again updated with new instructions; button 790 is added to user agent 142 GUI, and may be employed by the user to indicate approval of all PCB component positions, including those that have been created or modified, and to submit all XYRS data, including all new and modified data, to application server 124.

While the disclosed embodiments have been described with reference to one or more specific embodiments, the description is intended to be illustrative and is not to be construed as limiting. Various modifications may occur to those skilled in the art that, and while not specifically shown herein, would nevertheless be within the scope of the disclosed embodiments.

The invention claimed is:

1. A system for printed circuit board assembly comprising:
   a user interface provided on a display device for visual verification of printed circuit board design data;
   a user interface provided on the display device for inputting bill of material information that includes a list of components, wherein the user interface for inputting bill of material information comprises:
   a display for inputting the bill of material information;
   a display for searching for components to be added to the bill of material information; and
   a display for showing a visual representation of each component; and
   a user interface provided on the display device for verification, alteration and creation of component placement data, wherein the user interface for verification, alteration and creation of component placement data comprises a control for approving a footprint sprite overlaid on an image map of the printed circuit board design as being correctly positioned.

2. The system of claim 1, wherein the user interface for visual verification of printed circuit board design data comprises:
   an image map of a printed circuit board design; and
   navigation controls for creating zoomed and panned views of the image map, for reviewing and approving the printed circuit board design.

3. The system of claim 2, wherein the image map includes a visual representation of the printed circuit board design and each layer of the printed circuit board design as will be manufactured.

4. The system of claim 2, wherein the image map is created from a transformation matrix determined from a coordinate system derived from the printed circuit board design data and characteristics of the user interface for visual verification of printed circuit board design data.

5. The system of claim 1, wherein the user interface for verification, alteration and creation of component placement data comprises:
an image map of a printed circuit board design; and
a control for adding at least one footprint sprite overlay to at least a portion of the image map.

6. The system of claim 1, wherein the user interface for verification, alteration and creation of component placement data comprises:
an image map of a printed circuit board design; and
controls for adjusting a rotation and coordinates of a footprint sprite overlay on the image map.

7. The system of claim 1, wherein the user interface for verification, alteration and creation of component placement data comprises:
an image map of a printed circuit board design.

8. A method comprising:
providing a user interface on a display device for visual verification of printed circuit board design data;
providing a user interface on the display device for inputting bill of material information that includes a list of components and using the user interface for inputting bill of material information for:
inputting the bill of material information;
searching for components to be added to the bill of material information; and
showing a visual representation of each component; and
providing a user interface on the display device for verification, alteration and creation of component placement data and using the user interface for verification, alteration and creation of component placement data for approving a footprint sprite overlaid on an image map of a printed circuit board design as being correctly positioned.

9. The method of claim 8, further comprising:
displaying an image map of a printed circuit board design in the user interface for visual verification of printed circuit board design data; and
creating zoomed and panned views of the image map, for reviewing and approving the printed circuit board design.

10. The method of claim 9, further comprising including a visual representation of the printed circuit board design and each layer of the printed circuit board design as will be manufactured within the image map.

11. The method of claim 9, further comprising creating the image map from a transformation matrix determined from a coordinate system derived from the printed circuit board design data and characteristics of the user interface for visual verification of printed circuit board design data.

12. The method of claim 8, comprising using the user interface for verification, alteration and creation of component placement data for:
displaying an image map of a printed circuit board design; and
adding at least one footprint sprite overlay to at least a portion of the image map.

13. The method of claim 8, comprising using the user interface for verification, alteration and creation of component placement data for:
displaying an image map of a printed circuit board design; and
adjusting a rotation and coordinates of a footprint sprite overlay on the image map.

14. The method of claim 8, comprising using the user interface for verification, alteration and creation of component placement data for:
displaying an image map of a printed circuit board design.

* * * * *